United States Patent [19]
Masleid et al.

[11] Patent Number: 5,815,687
[45] Date of Patent: Sep. 29, 1998

[54] APPARATUS AND METHOD FOR SIMULATING DOMINO LOGIC CIRCUITS USING A SPECIAL MACHINE CYCLE TO VALIDATE PRE-CHARGE

[75] Inventors: Robert Masleid; Wolfgang Roesner; Amy May Tuvell, all of Austin, Tex.

[73] Assignee: International Business Machines Corporation, Armonk, N.Y.

[21] Appl. No.: 715,729

[22] Filed: Sep. 19, 1996

[51] Int. Cl.$^6$ ..................................................... G06F 9/455
[52] U.S. Cl. ............................................................. 395/500
[58] Field of Search ........................... 395/500; 364/488, 364/489, 490, 491, 578

[56] References Cited

U.S. PATENT DOCUMENTS

| | | | |
|---|---|---|---|
| 4,700,086 | 10/1987 | Ling et al. | 307/443 |
| 4,727,313 | 2/1988 | Barazilai et al. | 324/73 R |
| 4,780,626 | 10/1988 | Guerin et al. | 307/448 |
| 5,015,882 | 5/1991 | Houston et al. | 307/452 |
| 5,121,003 | 6/1992 | Williams | 307/452 |
| 5,208,490 | 5/1993 | Yetter | 307/452 |
| 5,399,921 | 3/1995 | Dobbelacre | 326/113 |
| 5,453,708 | 9/1995 | Gupta et al. | 326/98 |
| 5,513,132 | 4/1996 | Williams | 364/715.01 |
| 5,517,136 | 5/1996 | Harris et al. | 326/93 |
| 5,646,557 | 7/1997 | Runyon et al. | 326/97 |

OTHER PUBLICATIONS

Jha, Testing for Multiple faults in domino–CMOS logic circuits, IEEE, pp. 109–116, Jan. 1988.
Cheema, A new technique for toally self–checking CMOS circuit design for stuck–on and stuck–off faults, IEEE, pp. 155–159, Apr. 7, 1992.
Jha, Testing of multiple–output domino logic (MODL) CMOS circuits, IEEE, pp. 1–4, May 1, 1990.

*Primary Examiner*—Kevin J. Teska
*Assistant Examiner*—Matthew Clay Loppnow
*Attorney, Agent, or Firm*—Joseph C. Redmond, Jr.; Morgan & Finnegan, LLP; Anthony V. England

[57] ABSTRACT

A domino logic simulator for a CMOS domino logic circuit seeds all logic circuits under test with an "X" state before initialization of a special simulator machine cycle devoted to validating all pre-charge circuits in each stage of the CMOS domino logic circuit. In the special machine cycle, each stage of the circuit receives a discrete clock signal which is applied to the pre-charge and logic devices in precharge and evaluation phase sequences. The clock phase sequences in each stage propagate the "X" state at each logic circuit through the succeeding stages to provide an "X" output for the machine cycle, except a "0" state is provided as an output at the end of the machine cycle if the precharge circuit in each stage is functioning properly during the precharge sequences of the clock cycle applied to the stage. A clocked delay reset circuit in each stage provides the output of the stage. A static logic device in each stage saves power in transferring the output of a stage to a succeeding stage. A clocked buffer in each stage receives the propagated output from the previous stage for processing in the buffer stage. After pre-charge validation, a sequence of test patterns to the domino logic circuits occurs without testing the pre-charge circuit after each phase of the machine circuit.

15 Claims, 8 Drawing Sheets

TABLE 1

|  | ø1 | ø2 | ø3 | ø4 | ø1 |
|---|---|---|---|---|---|
| SIG C1_C3 | X | X | X | X | X |
| SIG C2_C4 | X | X | X | X | X |
| SIG C3_C1 | X | X | X | X | X |
| SIG C4_C2 | X | X | X | X | X |

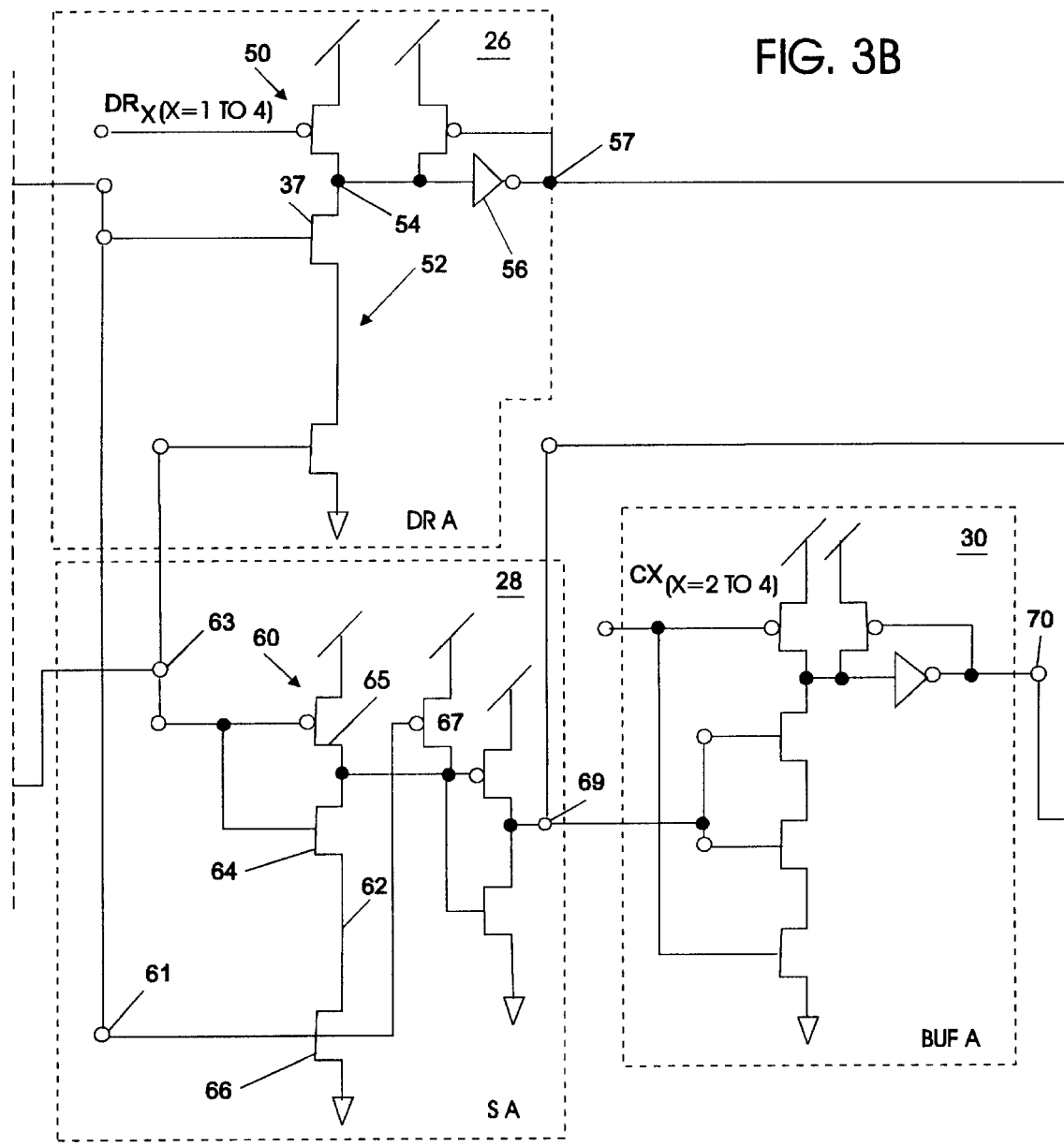

APPARATUS AND METHOD FOR SIMULATING DOMINO LOGIC CIRCUITS USING A SPECIAL MACHINE CYCLE TO VALIDATE PRE-CHARGE

BACKGROUND OF INVENTION

1. Field of Invention

This invention relates to simulating domino logic circuits for functional verification or simulation purposes. More particularly, the invention relates to an improved apparatus for and method of simulating domino logic circuits without testing of pre-charge circuits after each logic evaluation cycle.

2. Background of the Invention

Domino circuits are generally used to evaluate a logic operation based on a given input. The logic operation can be performed within one or more logic stages. Where multiple stages are present, an evaluation of one stage is rippled to a subsequent until a final evaluation is made in the final stage. Thus, the effect is for the logic to ripple ("domino") through the various stages, wherein each subsequent stage performs its evaluation based on the previous evaluation. After the completion of the evaluation in the final stage, an output is provided from the domino circuit through an output latch. One form of domino logic circuit uses complimentary metal oxide semiconductor (CMOS) devices. CMOS domino logic is normally used only in two phases: pre-charge and logic evaluation. Typically, the evaluate phase occupies half of the machine cycle and the pre-charge phase occupies the other half. There is a duality and exclusivity in the relationship between the pre-charge and evaluate phases that is useful to exploit for analysis and manipulation of this class of circuits. Due to power constraints, the evaluation and pre-charge phases are exclusive. The duality arises due to the need for PMOS dominance with NMOS inactivity during pre-charge and NMOS dominance and PMOS inactivity during evaluation. Functionally, both phases need to be confirmed for a given implementation over all machine states. However, the functionality of the pre-charge phase is very repetitive and should have the same outcome independent of the state of the inputs. Proof of this pattern independence is difficult to achieve with traditional exhaustive simulation techniques where the pre-charge phase is modeled as it occurs in reality interleaved between every evaluate phase. Since the evaluate and pre-charge phases are non-overlapping in time and evaluation value is not dependent on a pre-charge value (other than electrically it must have happened) the evaluate and pre-charge phases are separate verification problems. Once separated, the redundancy of simulating pre-charge for every circuit on every machine cycle is removed, improving simulator performance for the critical functional pattern testing. With proof of pre-charge removed from functional simulation, it is unnecessary to simulate the pre-charge phase following every evaluate phase, a two times speed-up can be achieved for a one-to-one pre-charge to evaluate phase ratio, assuming that every circuit pre-charges at least once per machine cycle.

Prior art patents related to simulating domino logic circuits are as follows:

U.S. Pat. No. 4,727,313 issued Feb. 23, 1988, discloses a method of fault simulation for domino circuits by replacing each switchlevel logic tree by a three section equivalent Boolean tree.

U.S. Pat. No. 4,780,626 issued Oct. 25, 1988, discloses a domino-type MOS logic gate having an MOS sub-network to prevent an unwanted discharging of the pre-charging level in response to at least one input data to a logic circuit being stabilized to slowly, that is to say not before the clock signal has changed levels.

U.S. Pat. No. 5,015,882 issued May 14, 1991, discloses a compound domino CMOS circuit in which logic input transistors are split into multiple cascaded sections, each section providing a separate preliminary output node. Each cascaded section processes respective input logic signals to produce independent preliminary outputs. The preliminary output node of each section is connected to a static logic gate which logically combines the signals of the preliminary outputs to produce a circuit output according to the logic function desired.

U.S. Pat. No. 5,121,003 issued Jun. 9, 1992, discloses a CMOS domino logic normally used only in two phases: pre-charge and logic evaluation. A third phase to store data allows domino logic gates to be cascaded and pipelined without intervening latches.

U.S. Pat. No. 5,399,921 issued Mar. 21, 1995, discloses a dynamic complimentary pass-transistor logic circuit for multi-level logic which does not require pass-transistors with specially designed threshold voltages.

U.S. Pat. No. 5,453,708 issued Sep. 26, 1995, discloses a clocking scheme for an improved latching of an output from a domino circuit by delaying a pre-charge of a domino node. The pre-charge delay is achieved by introducing a delay in the clocking circuitry which activates the pre-charging of the domino node. No delay is introduced in the data path in order not to delay the evaluation and transmission of the data signals. When the pre-charging phase commences, the pre-charging of the domino node is delayed until the output latch is completely deactivated, thereby ensuring that the pre-charge is not latched out to corrupt the data being transmitted.

U.S. Pat. No. 5,513,132 issued Apr. 30, 1996, and filed Oct. 24, 1991, discloses a CMOS domino logic which includes a third phase to store data. The third phase is in addition to the normally used pre-charge of logic evaluation phases and provides a logic structure of cascaded domino logic gates which are pipelined without intervening latches for memory storage.

U.S. Pat. No. 5,517,136 issued May 14, 1996, and filed Mar. 3, 1995, discloses domino logic circuits with automatic borrowing of time that might be leftover from a previous clock cycle.

None of the prior art recognizes the advantage of separating the pre-charge valuation from functional valuation or stated another way, validating logic circuits without validating interleaved pre-charge circuits thereby resulting in a two time speed-up of the functional simulation of domino logic circuits.

SUMMARY OF THE INVENTION

An object of the invention is an improved apparatus for and method of simulating domino logic circuits under test.

Another object is an improved apparatus for and method of simulating precharge validation in a single machine cycle which significantly increases logic simulation that can be performed in a domino logic circuit in a given time period.

Another object is an improved apparatus for and method of simulating CMOS domino logic within a machine cycle.

Another object is an improved apparatus for and method of simulating domino logic circuits in which pre-charge validation occurs in a separate machine cycle before logic simulation.

Another object is an improved apparatus for and method of simulating domino logic circuits using an "X" or "don't care" input state to all logic circuits during a pre-charge validation cycle.

These and other objects, features and advantages are achieved in an improved apparatus for and method of testing CMOS domino logic circuits in which pre-charge validation and functional evaluation are separated. An "X" or "don't care" state is used as an input to logic circuits during validation of the pre-charge phase rather than using the variety of patterns presented during the evaluate function. Since the evaluate and pre-charge phases are non-overlapping in time, and the evaluation value is not dependent on the pre-charge value (other than electrically it must have happened) separate verification problems exist. The pre-charge phase can be handled in a special simulation run which will be a minimum of as many cycles as there are phases. However, some clock schemes will require an addition of 1 or 2 simulation cycles to compensate for startup artifacts. For example, where one machine cycle equals four phases, an "X" state is used to indicate an input of either one or zero to a logic circuit during pre-charge validation. The "X" state is an accurate representation of the input conditions under which pre-charge must resolve. That is to say, the output of a logic circuit must present a known value following a pre-charge phase independent of the input state. Initially, the CMOS domino logic circuits are seeded with every node set to an "X." The only input applied during this state is the chip clock wave form during the four phases of the machine cycle. Correct pre-charge function requires that all dynamic outputs resolve to a known value or a "zero" state, due to the dominance of the clock on the PMOS devices and the activity of the NMOS devices. Circuit models are written such that the activity of both logic NMOS and PMOS devices result in a propagation of an "X" output. Circuits which are not switchable, based on the clock, continue to output an "X." Circuits which require that the input be set up by another device resetting either in a current phase or a previous phase but overlapping phase will also propagate a "X" if incorrectly stimulated. There is no opportunity for a desired set-up value to arrive at an input due to a previous evaluate phase, thus introducing pattern dependence.

In one form, a domino logic simulator for a CMOS domino logic circuit seeds all logic circuits with an "X" state before initialization of a special simulator machine cycle devoted to validating all pre-charge circuits in each stage of the CMOS domino logic circuit. In the special machine cycle, each stage of the circuit receives a discrete clock signal which is applied to the pre-charge and logic devices in precharge and evaluation phase sequences. The clock phase sequences in each stage propagate the "X" state at each logic circuit through the succeeding stages to provide an "X" output for the machine cycle, except a "0" state is provided as an output at the end of the machine cycle if the precharge circuit in each stage is functioning properly during the precharge sequences of the clock cycle applied to the stage. In an example circuit, a clocked delay reset circuit in each stage provides the final logic output of the stage. The clocked delay reset circuit is useful because of a constrained reset window. A static logic device in each stage saves power by reducing clock power while transferring the output of a stage to a succeeding stage. A clocked buffer in each stage receives the propagated output from the previous stage for processing in the stage. After pre-charge validation, a sequence of test patterns can be applied to the domino logic circuits occurs without testing the pre-charge circuit after each phase of the machine circuit.

To summarize, this invention removes the pre-charge phases from the functional simulation environment, thus increasing the available simulation bandwidth. An "X" state is used to prove that pre-charge will occur conclusively every cycle from every possible machine state without inserting the pre-charge after simulation of every possible machine state-simulation. Without the pre-charge phase, the functional simulation now returns to the appearance of a static design, thus allowing reuse of existing techniques. The cost of this method is the support of a three-state (1,0,X) simulation environment.

DESCRIPTION OF THE DRAWING

The invention will be more fully understood from a following detailed description of preferred embodiment taken in conjunction with the appended drawing, in which:

FIGS. 3A–3C are embodiments of circuit elements incorporated into the stages of FIG. 2;

DESCRIPTION OF PREFERRED EMBODIMENT

A simulator 10 is coupled to a CMOS domino circuit under test 12 through a series of clock lines 14 and signal lines 16. For purposes of the present invention, the simulator provides eight discrete clock signals (to be described in connection with FIG. 4), each requiring a separate clock line coupled to a different stage of the circuit under test. A plurality of feedback lines 18 are returned by the circuit 12 to the simulator 10 for evaluation purposes. One simulator appropriate for the present invention is "Leapfrog", manufactured and sold by Cadence, San Jose, Calif. For purposes of the present invention, however, any conventional programmable simulator may be employed in practicing the invention.

Figure 2:
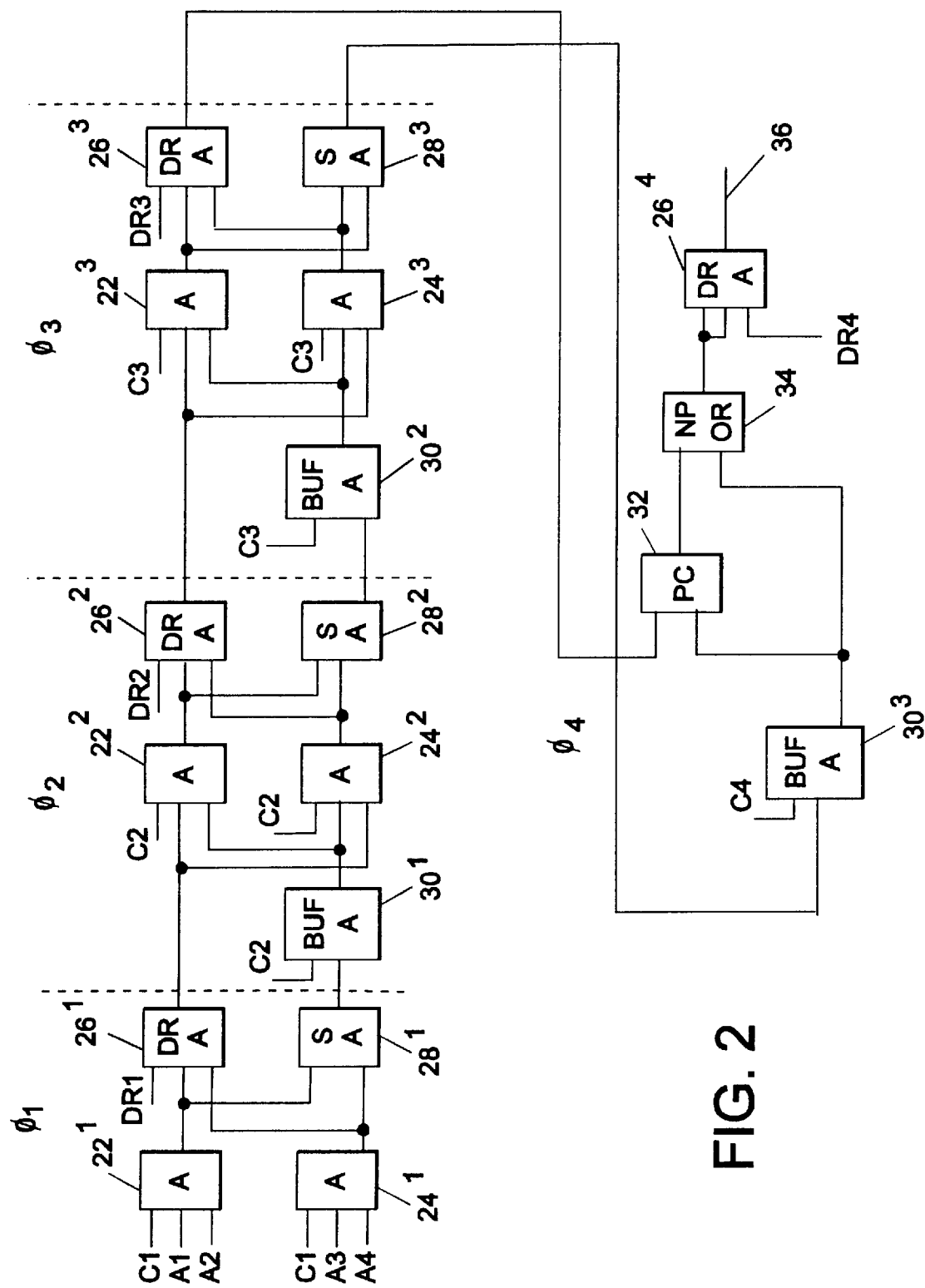
FIG. 2 is a representation of a CMOS domino logic circuit as an example of a circuit under test for purposes of FIG. 1.

In FIG. 2, a four-stage domino logic circuit under test using CMOS devices is shown for purposes of describing the invention. It should be understood that, while a four-phase domino logic circuit is shown, the invention is applicable to any number of stages or phases where each subsequent stage performs its evaluation based on a previous evaluation, and in the final stage, an output being provided indicative of the validation of the precharge circuits in all stages. Further, the invention is applicable to all circuit types which adhere to the following criteria:

Clock gates all reset activity.
Reset is monotonic.
Clock gates all evaluate activity.
Evaluate is monotonic.
Reset and evaluate phases are disjoint.
Duration of each phase is controlled by the clock.
All circuits reset once per clock edge and evaluate once per clock edge.

The circuit under test 12 includes multiple cascaded stages using clock signals C1 . . . C4, and DR1 . . . 4, respectively. Each stage includes AND circuits 22 and 24, the output of each AND being coupled to a delayed reset (DR) 26 and a static AND 28. Each AND circuit (as will be described more fully hereinafter in connection with FIGS. 3A–3C) includes a pre-charge circuit and a logic circuit. The output of each DR circuit is provided as an input to the ANDs 22/24 in the succeeding stage. The output of each static AND is provided to the succeeding stage as an input to a buffer AND 30 which provides an output to each AND 22/24 in the next stage.

An input stage or stage 1 receives clock signal C1 at the AND circuits $22^1$, $24^1$ and clock signal DR1 at the delay reset DR $26^1$. AND circuits $22^1$ and $24^1$ also receive logic inputs A1 ... A4.

In stage 2, the logic circuits $22^2$, $24^2$, and buffer circuit $30^1$ receive clock signal C2. DR 26(2) receives Clock signal DR2. In like manner, stage 3 receives clock signals C3 at the AND circuits $22^3$, $24^3$ and buffer $30^2$. The delayed reset DR 26(3) receives clock signal DR3.

In stage 4, the ANDs 22/24 occurring in stages 1 ... 3 have been replaced with a non-inverting precharge OR circuit 34 and a pseudo clock AND 32. A buffer $30^3$ receives the output of the static AND 28(3) and provides a first input to the pseudo clock 32 and to the non-inverting precharge circuit 34. The pseudo clock receives the output of the DR circuit 26(3) as a second input and provides an output as a second input to the non-inverting precharge circuit 34. The output of the non-inverting precharge circuit 34 is provided as a first and a second input to the DR circuit 26(4). A clock signal C4 is provided to the buffer 30(3) and a clock signal DR4 is provided to the DR circuit 26(4). An output 36 from DR 26(4) provides an indication whether or not each precharge circuit included in each logic circuit will charge after completion of the clocking of the respective stage.

Figure 3A:
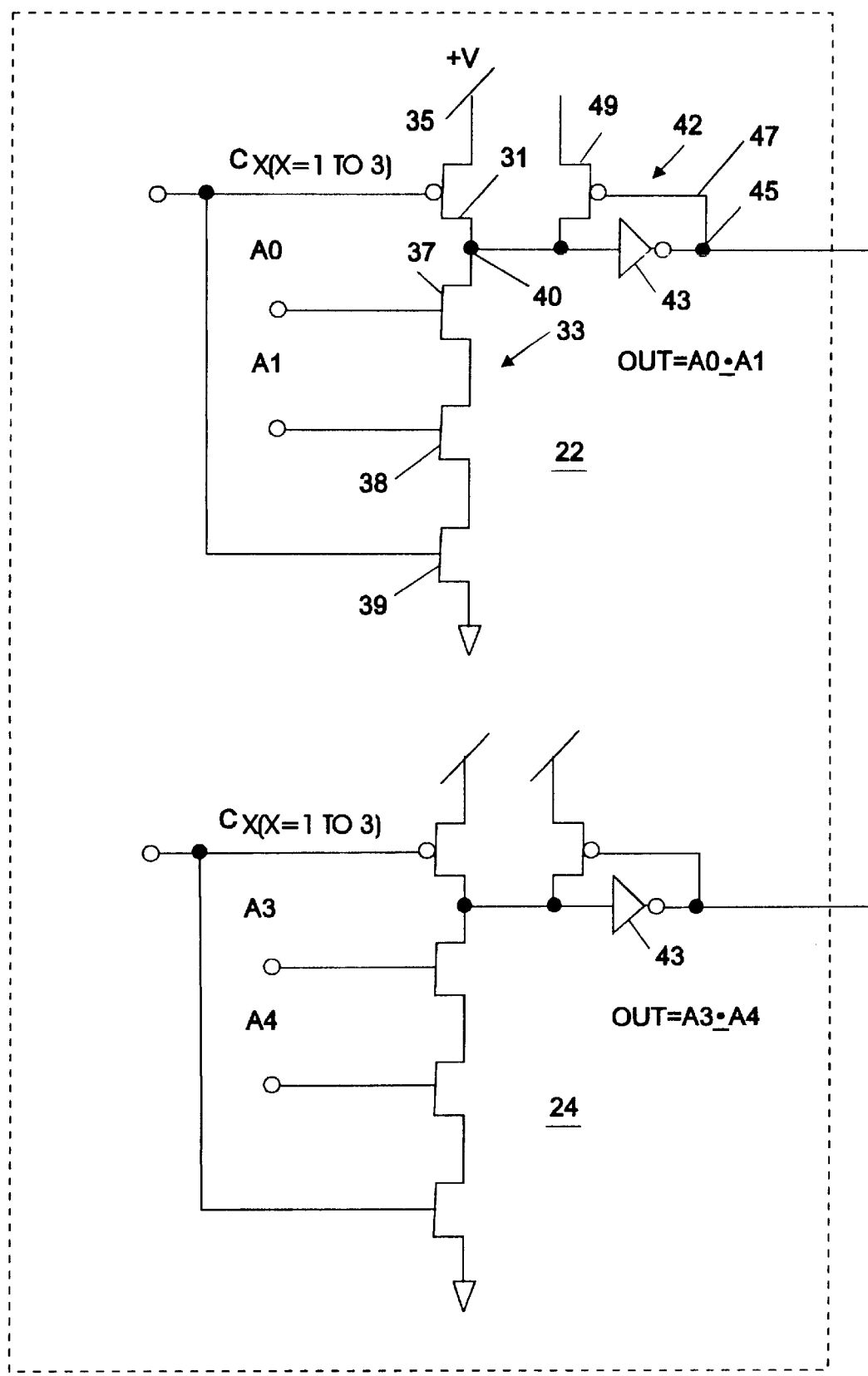
Figure 3C:
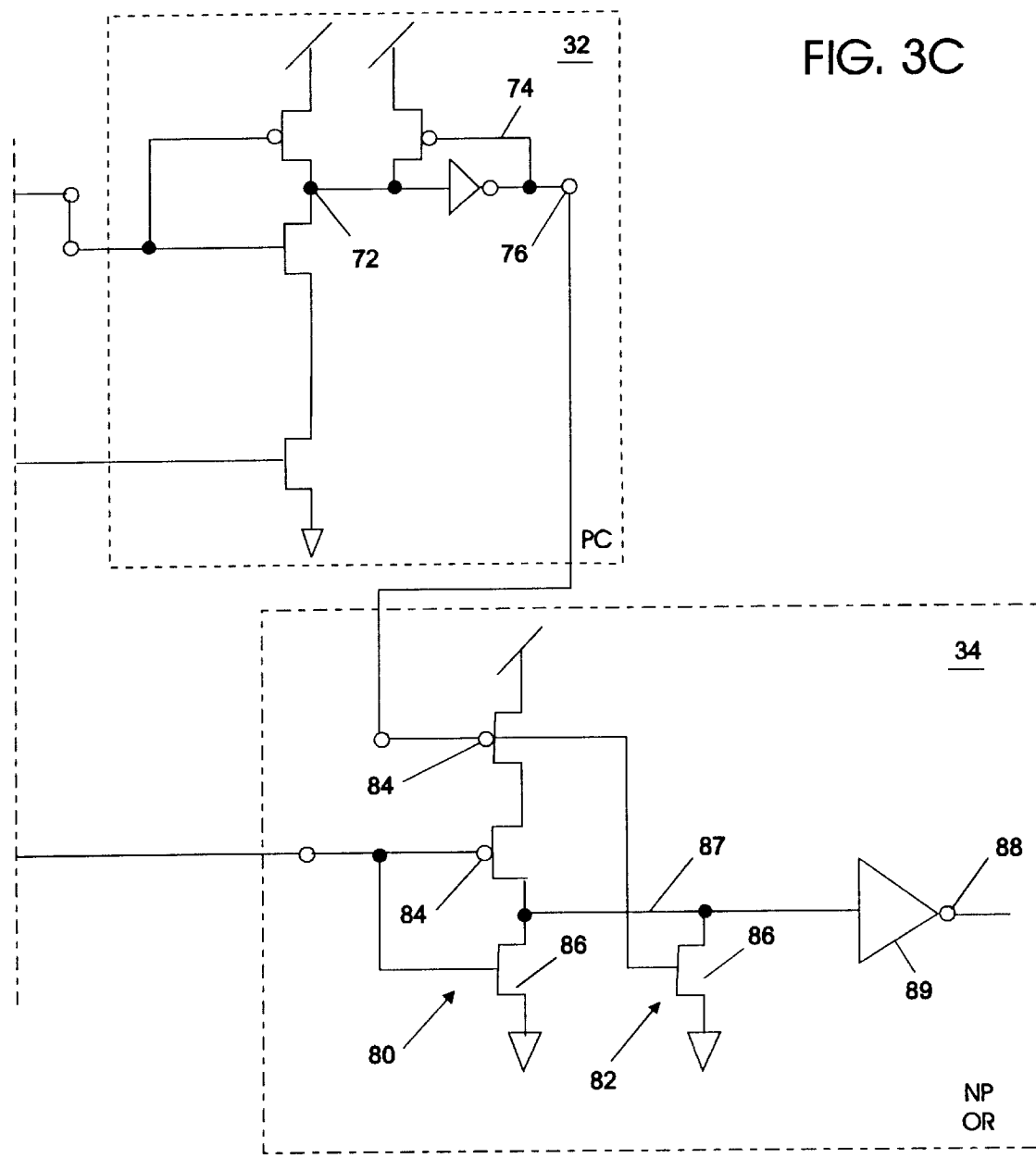

Turning to FIGS. 3A–3C, the embodiments for the circuit or functional elements included in each stage of the circuit under test will now be described.

In FIG. 3A, each AND circuit 22/24 includes a precharge circuit 31; a footed logic circuit 33 and a half-latch 42. The "foot" device is the nmos device 39 attached to the clock, the device cutting the path to ground for all input combinations. A number of implementations of the half latch are acceptable. The precharge circuit includes a PMOS device 35 coupled at one end to a V+ voltage supply and at the other end to the logic circuit 33 comprising serially connected NMOS devices 37, 38 and 39 with the drain of device 39 being connected to ground. A clock signal is provided to the gates of devices 35 and 39 while logic signals A1 ... A4 are provided to devices 37 and 38. An output node 40 is provided as an input to a half latch 42 which serves as a latch and inverter. The half latch 42 includes an inverter 43 having an output 45 and feedback loop 47 connected to a PMOS device 49 at its gate electrode. The PMOS device 49 is connected between a V+ voltage supply and the input of the inverter 43, the device 49 serving as a clamp when the inverter 43 is turned on.

The operation of the ANDs 22/24 is straight forward, that is to say, when the logic inputs A1 ... A4 are up and the clock is up, the devices 37, 38, and 39 are on and the device 35 is off, which grounds the node 40. The device latches and inverts the output of the node 40 to provide an up level or "1" output at node 45. When the clock is down the precharge circuit is turned on by the PMOS device 35 while the NMOS device 39 is turned off which provides an up or "1" level at the node 40 which is inverted by the device 42 to provide a down level or "0" output at the node 45.

In FIG. 3B, the delayed reset DR circuit 26 includes a precharge circuit 50 and grounded logic circuit 52. The precharge circuit 50 receives a clock signal DR(x) while the logic circuit receives inputs from the ANDs 22/24. A node 54 provides an output to a half latch 56 which inverts and latches the voltage level as described in connection with FIG. 3A. When the precharge circuit is turned off, a "1" or up level appears at an output node 57 as dictated by the state of the non-clock outputs. When the precharge circuit is turned on, a "0" down level appears at the output node 57.

In FIG. 3B, a static AND 28 comprises a PMOS precharge circuit 60 including devices 65 and 67 and an NMOS logic circuit 62 including devices 64 and 66. The PMOS devices 65 and 67 are matched to the NMOS device as part of the AND 28 and connected to an output node 69. The logic signal from the AND device 24 is provided at node 63 for the gates of the precharge 65 and the logic device 64. The logic signal from the AND 22 is provided at node 61 for the gates of the logic device 66 and the device 67. When the logic signals are up the PMOS devices are off which provides a down or "0" level at a node 69. When the logic signals are down the PMOS devices are turned off which provides an up or "1" level at the output node 69.

In FIG. 3B, the buffer circuit 30 is essentially the same as that described in connection with FIG. 3A and provides the "1" and "0" latched output at node 70 for the clock signal supplied to the stage.

In FIG. 3C, the pseudo clock 32 has an unclocked input which controls both precharge and evaluate. The pseudo clock 32 has essentially the same inputs as the static AND 28. A node 72 provides an input to half latch 74 which provides an inverted output at node 76. The operation of the pseudo clock 32 is essentially the same as the ANDs 22/24. When the inputs are up, an up level appears at the output 76. When the inputs are down, a down level appears at the node 76.

In FIG. 3C the non-inverting precharge circuit 34 includes OR gates 80 and 82, each comprising a PMOS device 84 in series with an NMOS device 86. A node 87 at the junction of devices 80/82 is provided to an output terminal 88 through a conventional inverter 89. The input to the OR circuit 80 is provided from the pseudo clock 32. The input to the OR circuit 82 is provided the buffer circuit 30(3). When the inputs are up, the PMOS devices are turned off and a down level is provided by the NMOS devices 86 at the node 87 which is inverted by the inverter 89 to provide an up or "1" level at the output node 88. When the inputs are down, the NMOS devices are turned off and the PMOS devices provide an up level at the node 87 which is inverted by the inverter 89 to provide a down or "0" level at the output node 89.

Figures 1, 6:
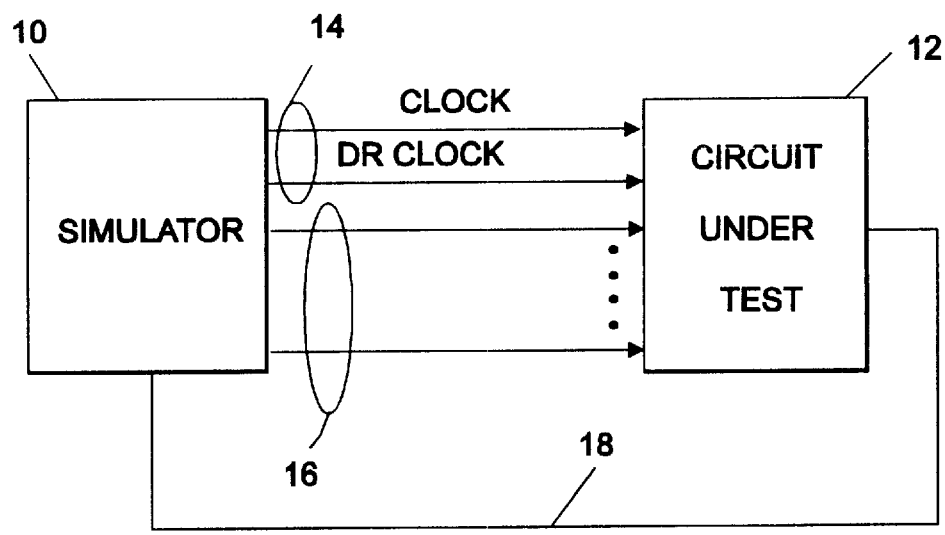
FIG. 1 is a block diagram of a simulator connected to a circuit under test for functional verification or simulation purposes.
FIG. 6 is a table of clock cycles for FIG. 5B with undesired output signals.

Having described the multiple stage domino logic circuit under test 12 and the circuit embodiments in each stage, the operation of the invention will now be described in conjunction with FIGS. 4, 5, and 6.

Before describing the operation, it is believed in order to provide a perspective of the invention. It will be recalled from the prior art description that multiple stage domino logic circuits perform logic simulation by "rippling" a series of logic patterns through the multiple stages of the domino circuit, each stage performing a logic evaluation based on the previous stage evaluation and validating the pre-charge circuit in a machine cycle. The repetitious pre-charge validation for each stage occupies nearly half of the received cycles of the simulation device. The present invention performs pre-charge validation and logic simulation as separate runs. The pre-charge validation is performed in a single machine cycle after which logic simulation is performed until all logic evaluation is completed. A pre-charge validation is performed by the use of a "X"-state representative of a logic "1" or "0". Initially, each logic node of the circuit is set to an X-state. The only input to the circuit under test are the clock wave forms for each stage, which, for present purposes, is assumed to be four clock signals, each having four phases. A correct pre-charge function for each stage of the domino circuit requires that all dynamic outputs resolve to a known value, which in the present instance, is assumed to be a logic "0" at the circuit output terminal 90 for the last phase of the machine cycle due to the dominance of the clock on the PMOS devices and the activity of the NMOS devices.

Figure 4:
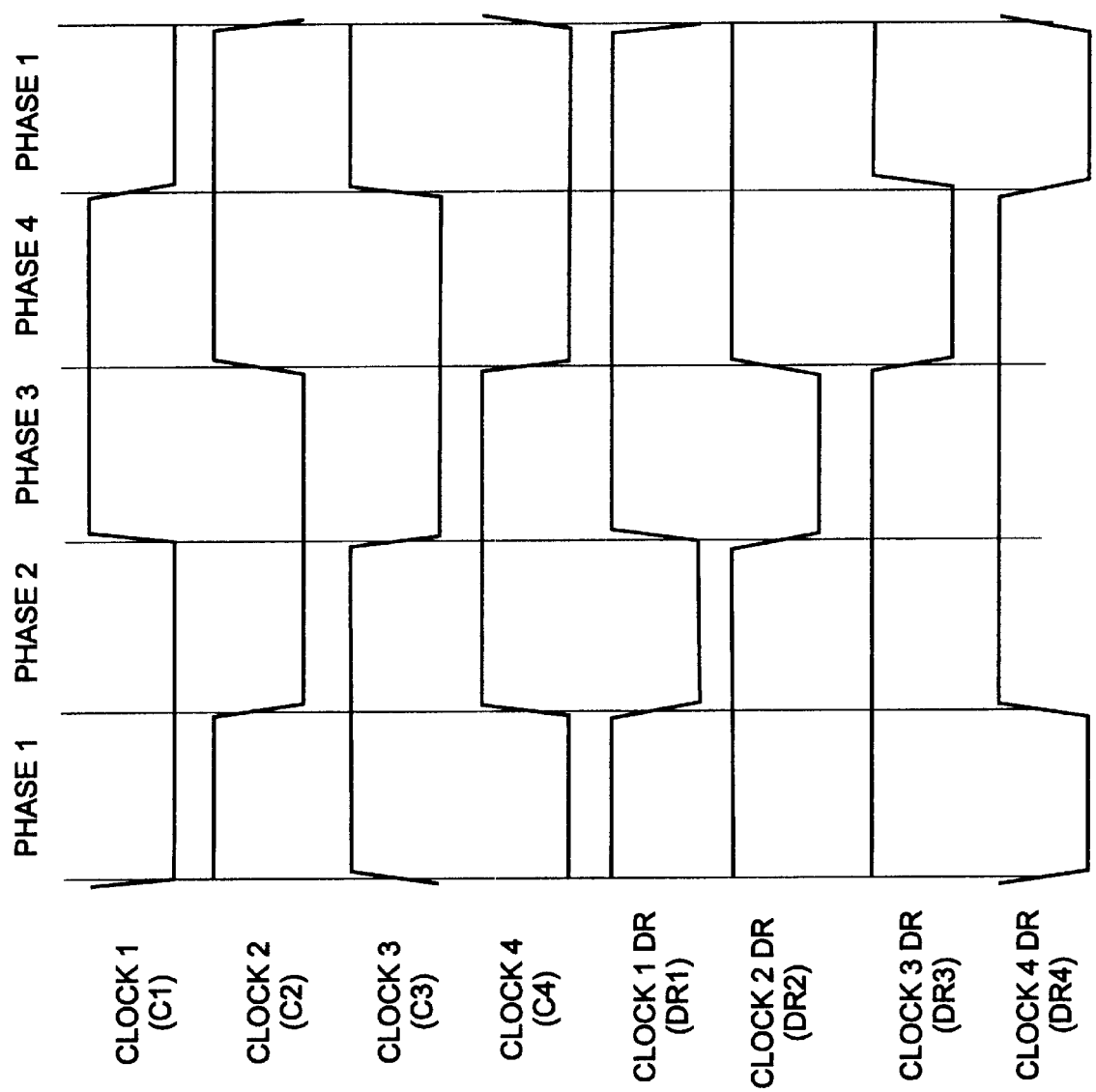
FIG. 4 is a representation of clock wave forms applied to the stages of the circuit of FIG. 2 in testing the pre-charge circuits thereof.

Now turning to FIG. 4, a wave form is shown for each clock signal C1 . . . C4 provided to AND 22/24 and buffer 30 circuits in each stage, each wave form occurring in four phases. The DR clock signals DR1 . . . DR4 are supplied to the delay reset circuit in each stage. The circuit details for generating the clock signals are described in Ser. No. 08/538,173 (AT9-94-198), assigned to the assignee of the present invention which is fully incorporated herein by reference. In FIG. 4, the down level of each clock signal is the precharge phase preceding the logic evaluation phase for each stage of the domino circuit. The precharge and evaluation phases, each occupy half of a machine cycle, except the DR (delayed reset) clocks which precharge for a ¼ cycle and evaluate for ¾ cycle. As shown in FIG. 4, each succeeding precharge phase turns on before the precharge phase is completed in the previous phase. In this way, the precharge in the previous stage can be assured. To verify the precharge phase took place in a stage, valid precharge values must propagate through the circuit. These values are most difficult to achieve at the delay reset circuit because of the narrower precharge window. A delay reset (DR) clock signal which is up for three clock phases, only turns down in the last half of the precharge phase for the stage. The delay reset, responsive to the DR clock signal, is off for the up phases of the DR clock signal and provides X output to the succeeding stage. When the DR clock signal is down, the delay reset turns on and confirms the logical precharge of the stage to the succeeding stage. If the precharge phase properly occurred in the machine cycle, a logic zero transfers from this stage which is logically combined in the succeeding stage with the logic zeros from other circuits, e.g., the delay reset. If the precharge phase does not properly occur, an X state will transfer to the succeeding AND gates. The confirmation of the precharge phase at the delay reset for a stage occurs in the next phase due to the delay in turning on the delay reset circuit. Thus, if the logical results from a stage feeding the DR are 0/0/X/X/X the delay reset outputs will be X/0/X/X/X where O/O/X/X/X represent the probed values at a node for phases 1, phase 2, phase 3, phase 4 and phase 1, respectively.

Figure 5A:
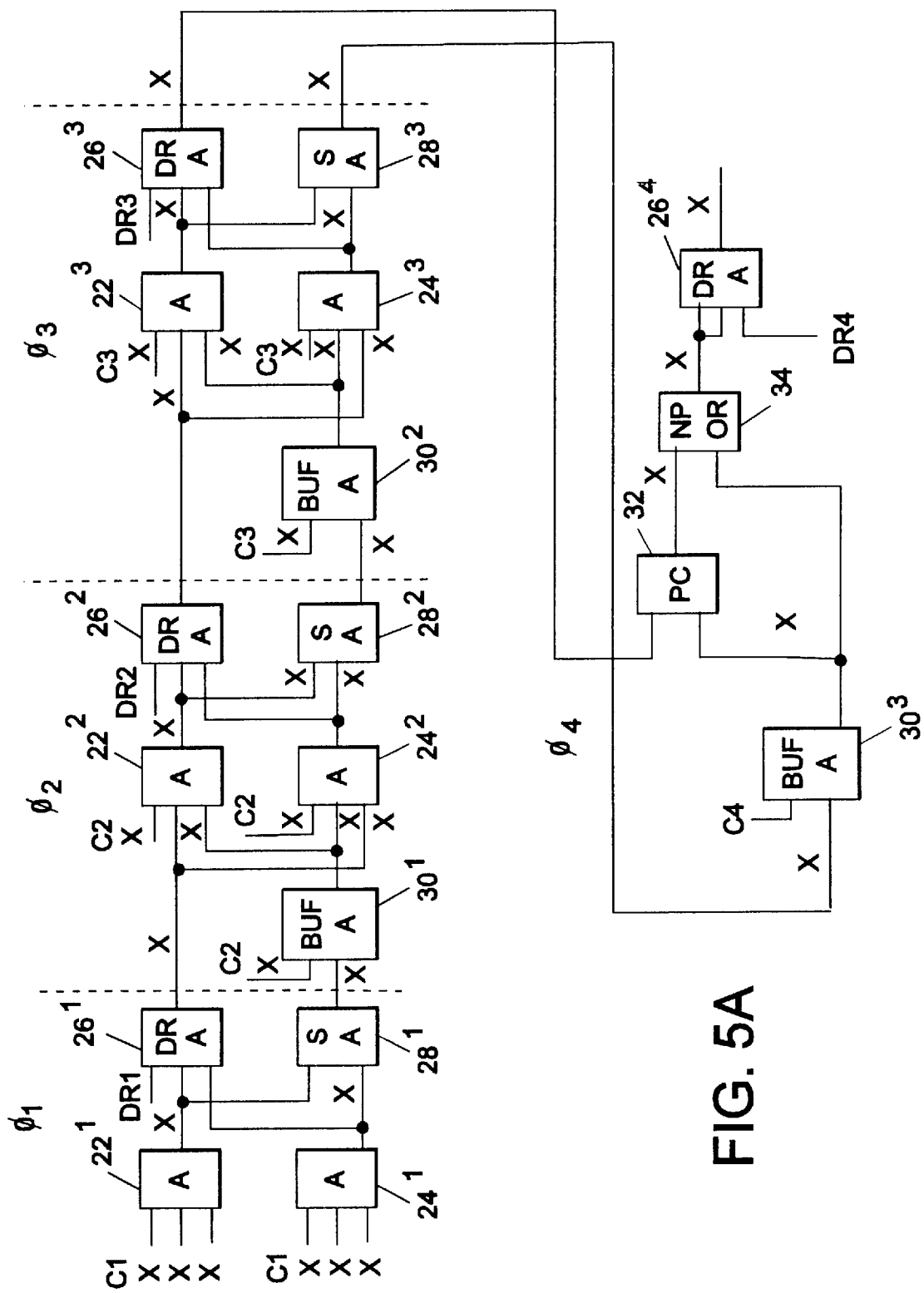
FIGS. 5A–5B are representations of the circuit of FIG. 2 incorporating the principles of the present invention.

Turning to FIG. 5A, the circuit under test is shown in the initial condition for a pre-charge validation. In the initial condition, all nodes and the C1 . . . C4 and DR1 . . . DR4 are set in an X-state. The output at the non-inverting pre-charge circuit 34 is an X as well as at the output of the delayed reset circuit 26[4].

Figure 5B:
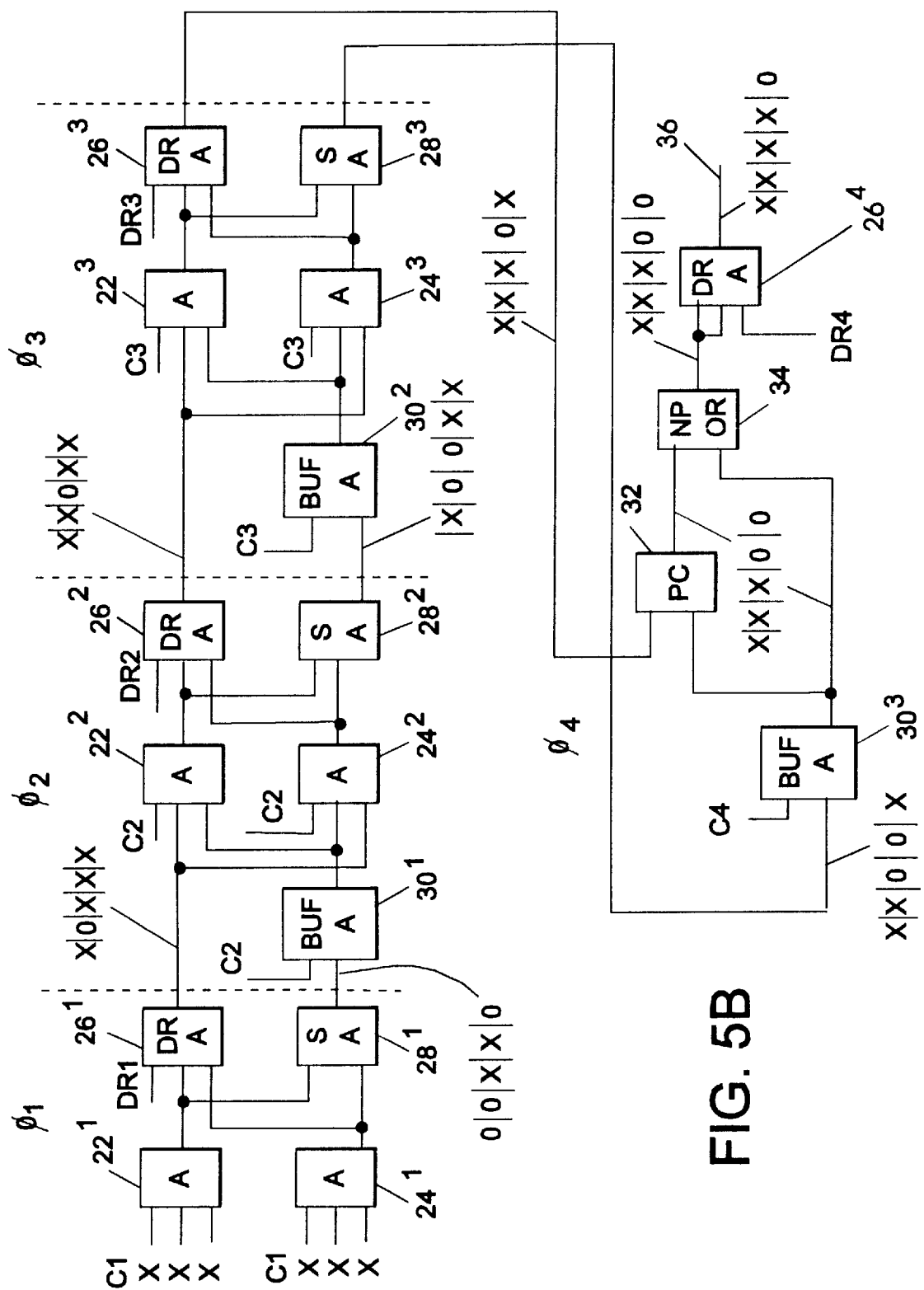

In FIG. 5B, the clock signals C1, C2, C3, and C4 are applied to the respective stages at the indicated circuit elements. That is to say, the clock signals C1 . . . C4 are applied to their respective AND circuits 22 and 24[1] and buffer circuits 30. It will be recalled from the description of the AND circuit shown in FIG. 3A that a down level turns on the pre-charge circuit and provides a zero or down level at the output node due to the inverting action of the inverter 43. An up level turns off the precharge circuit and provides an up or "1" level at the output of static circuit 28. In stage 1, when clock 1 is down for Phases 1 and 2, a zero output is provided from the stage as indicated at the output of static circuit 28(1). In Phases 3 and 4, clock 1 is up, which turns off the pre-charge circuit and passes the X signal as shown at the output of static circuit 28(1). In Phase 5 or the wrap around or start of the next phase, the clock signal C1 is a down level and the output of Phase 1 is repeated. Thus it can be shown that the outputs of stage 1 for clock signal C1 is zero during Phase 1; zero during Phase 2; X during Phase 3; X during Phase 4, and zero during Phase 5, the start of the next machine cycle. Similarly, it can be shown that the output from stage 2 for clock 2 is X during Phase 1; zero during Phase 2; zero during Phase 3; X during Phase 4, and X during Phase 5. Likewise, the outputs from stage 3 can be shown to be X for Phases 1 and 2; zero for phases 3 and 4, and X for Phase 5. Stage 4 outputs can be shown to be X for Phases 1, 2, and 3 and zero for Phases 4 and 5.

In like manner the DR clock signals DR1 . . . DR4 are supplied to the delay reset circuits in the respective stages. The output for the delayed reset 26(1) responding to clock signals DR1 can be shown to be X/0/X/X/X at stage 1 for Phases 1 . . . 5. The outputs of stage 2 at the delayed reset 26(2) can be shown to be X/X/0/X/X for Phases 1 . . . 5. The outputs of stage 3 at the delayed reset 26(3) can be shown to be X/X/X/0/X for Phases 1 . . . 5. The outputs of stage 4 at the delayed reset 26(4) can be shown to be X/X/X/X/0 at node 90 for Phases 1 . . . 5. A "0" state at node 90 in phase 5 indicates all precharge circuits in stages 1–4 operated properly for precharge evaluation in the stages. An "X" output at node 90 in phase 5 indicates at least one precharge circuit did not operate properly for precharge evaluation.

Defective pre-charge circuits occur in a stage when the pre-charge circuit is turned on by the clock, while logic inputs from a previous stage are supplied to the stage and turn on the AND circuits. In such a case, you have a direct short circuit between the voltage supply and ground for the stage. Besides receiving logic levels from previous stages, the delayed reset output may also provide signals which contribute to turning on the AND circuits to short circuit the stage. The likely combinations of clock and input signals occurrences in which pre-charge circuits cause short circuits are set forth in the Table 1 shown in FIG. 6.

Table 1 shows by row, combinations of clock signals to stages phase 1, etc. which result in undefined outputs for the stages. Thus row 1 indicates the results of the combined clock signals C1 and C3 at phases 1 and 2 will produce undefined outputs, e.g. short circuits and represented in the Table 1 by bold Xs in row 1. Likewise in row 2, 3, and 4 the bold Xs represent short circuit conditions for the indicated stages. Table 1 represents the most extreme signal condition to cause these undesirable results. There are other signal conditions which initially precharge a phase, but devolve to a short circuit or undesirable condition. In such a case, the undesirable condition would be represented in Table 1 as a single bold X for the row in lieu of a double bold X In Phase 1, when clock 1 is down and clock 3 is up, it is likely that an undesired pre-charge test may occur in Phase 1. Likewise, in Phase 1, when clock 2 is up and clock 4 is down, another instance occurs to short circuit the pre-charge circuit of stage 1. An example of an erroneous circuit is one which is expected to precharge in phase 1 but receives inputs which precharge in both phase 1 and phase 3.

In Phase 2, the down level of clock 1 and up level of clock 3 continues to cause a potential short circuit condition in Phase 2. Also, the down level of clock 2 and up level of clock 4 may cause a short circuit condition for any precharge circuit in stage 2.

In Phase 3, the down level of clock 2 and the up level of clock 1 may cause a short circuit condition in the pre-charge circuit for stage 3. Also, the down level of clock 3 and up level of clock 1 is another potential condition for short circuit of the pre-charge circuit in stage 3.

In Phase 4, the down level of clocks 3 and 4 and the up level of clock 1 and the down level of clock 4 may cause a short circuit condition to exist in the pre-charge circuit for stage 4.

In summary, the invention discloses an apparatus and a method for separating the pre-charge validation from the functional validation of each stage in a multi-stage domino circuit. Through the use of an "X" state propagated through the multistages of a CMOS domino logic circuit, the pre-charge phases of all stages can be validated, in lieu of using a variety of test patterns presented during the evaluation phase of each stage. Since the evaluation and pre-charge phases are non-overlapping in time, and the evaluation phase is not dependent on the precharge phase, the logic and pre-charge verification problems are separated. Once separated, the redundancy of simulating the recharge for every circuit on every machine cycle is removed, improving simulated performance for the critical functional patterns of which there are usually thousands. The invention further discloses special circuits, such as the static And 28 in each stage; the pseudo clock 32 and non-inverting precharge circuit 34 to reduce power and increase the speed of charging the pre-charge circuits in a domino logic circuit.

While the invention has been described in a specific embodiment, various modifications may be made therein without departing from the spirit and scope of the invention as defined in the appended claims, as follows.

We claim:

1. A domino logic simulator for functional verification or simulation of multistage domino circuits comprising:
   a) a precharge and logic circuit in each stage of the multistage domino logic circuit subject to a three stage simulation environment comprising a logic one (1) state; a logic zero (0) state and a logic "X" or don't care state which may be a logic 1 or logic 0 state;
   b) means for supplying a sequence of test patterns to the multistage domino logic circuit for functional logic test purposes without testing the pre-charge circuit in each simulator cycle; and
   c) means for validating the pre-charge circuit output for the domino logic circuit in a special machine cycle in a logic "X" state regardless of the signal inputs to each stage of the multistage domino circuit.

2. The domino logic simulator of claim 1 further including means in each stage for verifying the precharge validation of the stage for functional verification of the stage.

3. The domino logic simulator of claim 2 further including a static logic circuit for transferring a logical result of a stage to a succeeding stage.

4. The domino logic simulator of claim 3 further including a buffer circuit in a stage for receiving a logical result of a previous stage for logic evaluation in the stage.

5. The domino logic simulator of claim 4 further including a clock signal and a delay clock signal connected to each stage of the multistage domino circuit, as appropriate.

6. The domino logic simulator of claim 5 wherein the clock signal for each stage has a precharge phase and a logic evaluation phase.

7. The domino logic simulator of claim 6 wherein the delay clock signal for each stage has a precharge phase which trails the precharge phase of the clock signal to the stage.

8. In a logic simulator for functional evaluation of multistage domino circuits including logic functions and pre-charge circuits in a machine cycle having a plurality of phases, a method of testing the logic functions without testing the pre-charge circuits after each test of the logic functions, comprising the steps of:
   a) supplying a sequence of test patterns to the domino logic circuit for functional logic evaluation during each phase of the machine cycle for the simulator, the logic circuits subject to a three stage simulation environment comprising a logic one (1) state; a logic zero (0) state and a logic "X" or don't care state which may be a logic 1 or logic 0 state;
   b) receiving at each stage of the multistage domino circuit at least one signal input representative of a logical state during each phase of the machine cycle; and
   c) validating the pre-charge circuit output for each stage of the multistage domino logic circuit in a special machine cycle for an "X" state, before or after the logic simulation regardless of the signal inputs to the stages circuit.

9. The method of claim 8 further including the step of:
   a) operating a delay reset or like circuit in each stage to aid in verifying the precharge validation of a stage for functional verification of the stage.

10. The method of claim 9 further including the step of:
    a) operating a static logic circuit for transferring a logical result of a stage to a succeeding stage.

11. The method of claim 10 further including the step of:
    a) operating a buffer circuit in a stage for receiving a logical result of a previous stage for logic evaluation in the stage.

12. The method of claim 11 further including the step of:
    a) providing a clock signal and a delay clock signal to each stage of the multistage domino circuit.

13. The method of claim 12 providing a precharge phase and a logic evaluation phase using a clock signal.

14. The method of claim 13 wherein the delay clock signal, if present, for each stage has a precharge phase which trails the precharge phase of the clock signal to the stage.

15. An article of manufacture, comprising:
    a computer usable medium having computer readable program means embodied therein for functional simulation of multistage domino circuits including logic circuits and pre-charge circuits for functional verification in a simulator within a machine cycle having multiple phases, the computer readable code program means in said article of manufacture comprising:
    a) computer readable code means for receiving at least one signal input representative of a logical state at each stage of the multistage domino circuits during each phase of the machine cycle, the domino circuits subject to a three stage simulation environment comprising a logic one (1) state; a logic zero (0) state and a logic "X" or don't care state which may be a logic 1 or logic 0 state;
    b) computer readable program code means for supplying a sequence of test patterns to the domino logic circuit for functional logic evaluation during each phase of the machine cycle; and
    c) computer readable program means for validating the pre-charge circuit output for each stage of the multistage domino logic circuit in a special machine cycle for an "X" state, before or after the logic simulation, regardless of the signal inputs to the domino circuit.

* * * * *